United States Patent
Imagawa

(10) Patent No.: US 10,229,972 B2
(45) Date of Patent: Mar. 12, 2019

(54) SEMICONDUCTOR DEVICE

(71) Applicant: FUJI ELECTRIC CO., LTD., Kanagawa (JP)

(72) Inventor: Tetsutaro Imagawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/607,697

(22) Filed: May 30, 2017

(65) Prior Publication Data

US 2017/0278929 A1 Sep. 28, 2017

Related U.S. Application Data

(63) Continuation of application No. PCT/JP2016/067597, filed on Jun. 13, 2016.

(30) Foreign Application Priority Data

Jun. 17, 2015 (JP) ................................. 2015-122037

(51) Int. Cl.
*H01L 21/02* (2006.01)
*H01L 29/10* (2006.01)
(Continued)

(52) U.S. Cl.
CPC ........ *H01L 29/1095* (2013.01); *H01L 21/265* (2013.01); *H01L 29/32* (2013.01);
(Continued)

(58) Field of Classification Search
CPC ................ H01L 29/1608; H01L 29/36; H01L 29/66348; H01L 29/0615; H01L 29/32;
(Continued)

(56) References Cited

U.S. PATENT DOCUMENTS 7,538,412 B2 * 5/2009 Schulze .............. H01L 29/7396
257/109
9,082,835 B2 * 7/2015 Fukui .................. H01L 29/1095
(Continued)

FOREIGN PATENT DOCUMENTS

JP 2003-533047 A 11/2003
JP 2010-541266 A 12/2010
(Continued)

OTHER PUBLICATIONS

Office Action issued for counterpart Japanese Application 2017-525230, issued by the Japanese Intellectual Property Office dated Nov. 7, 2017.
(Continued)

*Primary Examiner* — Vu A Vu

(57) ABSTRACT

A semiconductor layer of a first conductivity type has a plurality of impurity concentration peaks that are differently positioned in a first direction extending from a first surface to a second surface, and an integrated concentration obtained by integrating an impurity concentration value in the first direction from (i) the first surface that is a junction interface between the semiconductor layer of the first conductivity type and the semiconductor layer of the second conductivity type to (ii) a boundary between a first impurity concentration peak of the plurality of impurity concentration peaks that is the closest to the first surface and a second impurity concentration peak of the plurality of impurity concentration peaks that is the second closest to the first surface is equal to or lower than a critical integrated concentration.

14 Claims, 13 Drawing Sheets

(51) Int. Cl.
 *H01L 29/78*     (2006.01)
 *H01L 29/739*    (2006.01)
 *H01L 29/32*     (2006.01)
 *H01L 21/265*    (2006.01)
 *H01L 29/66*     (2006.01)

(52) U.S. Cl.
 CPC .......... *H01L 29/7397* (2013.01); *H01L 29/78* (2013.01); *H01L 29/66348* (2013.01)

(58) Field of Classification Search
 CPC ........... H01L 21/02529; H01L 29/7397; H01L 21/324; H01L 21/26506; H01L 21/02694; H01L 21/02609; H01L 21/265; H01L 29/78; H01L 29/861; H01L 29/1095
 USPC ....................................................... 257/655
 See application file for complete search history.

(56) References Cited

U.S. PATENT DOCUMENTS

| | | |
|---|---|---|
| 2002/0190281 A1 | 12/2002 | Francis et al. |
| 2006/0081923 A1 | 4/2006 | Mauder |
| 2008/0001257 A1 | 1/2008 | Schulze et al. |
| 2009/0184340 A1 | 7/2009 | Nemoto |
| 2010/0244093 A1 | 9/2010 | Rahimo et al. |
| 2012/0267681 A1 | 10/2012 | Nemoto et al. |

FOREIGN PATENT DOCUMENTS

| | | |
|---|---|---|
| JP | 2014-099643 A | 5/2014 |
| WO | 2011-052787 A1 | 5/2011 |

OTHER PUBLICATIONS

International Search Report for International Patent Application No. PCT/JP2016/067597, issued by the Japan Patent Office dated Jul. 19, 2016.

Office Action issued for counterpart Japanese Application No. 2017-242421, drafted by the Japan Patent Office dated Oct. 18, 2018.

* cited by examiner

SEMICONDUCTOR DEVICE

The contents of the following Japanese patent applications are incorporated herein by reference:
NO. 2015-122037 filed in JP on Jun. 17, 2015, and
NO. PCT/JP2016/067597 filed on Jun. 13, 2016.

BACKGROUND

Technical Field

The present invention relates to a semiconductor device.

In the conventional art, an insulated gate bipolar transistor (IGBT) device has a region doped with hydrogen ions and the like that may serve as a field stop layer (FS layer) (see, for example, Japanese Patent Application Publications Nos. 2010-541266 and 2014-99643).

In the IGBT, the FS layer is normally provided in the vicinity of the collector electrode. If the FS layer is positioned closer to the emitter electrode than normally, however, it becomes possible to reduce the oscillation that may occur at the time of switching and the leakage currents that may occur between the collector and the emitter when the gate voltage is zero and also to improve the reverse bias safe operation area (RBSOA). The effect of reducing the oscillation that may occur at the time of switching and the like is especially enhanced as the concentration of the FS layer increases. On the other hand, when the FS layer is positioned close to the collector electrode, the drift layer has a larger thickness than when the FS layer is positioned closer to the emitter electrode than normally. This improves the large-current-induced short-circuit withstand capability and the breakdown voltage. The effect of improving the large-current-induced short-circuit withstand capability and the like is especially enhanced as the concentration of the FS layer decreases. As discussed above, it is difficult to achieve both of the effects of reducing the oscillation that may occur at the time of switching and the like and of improving the large-current-induced short-circuit withstand capability and the like since they require conflicting characteristics for the FS layer.

Here, the large-current-induced short-circuit withstand capability is defined as the amount of currents flowing when the IGBT breaks down as a result of gradually raising the gate voltage. The large-current-induced short-circuit withstand capability is measured in the following manner. The duration of the switched-on period is fixed, the IGBT is switched on and off multiple times, and the gate voltage input into the IGBT is increasingly raised each time the IGBT is switched on. In this way, large currents are fed to the IGBT. If the FS layer is positioned closer to the emitter electrode than normally and has a higher concentration than normally, this reduces the holes moving from the collector side. As a result, the ratio of the electrons becomes higher than that of the holes in the components of the currents flowing through the IGBT, and the electric fields on the collector side increase. If the electric fields on the collector side increase too much, the IGBT ultimately breaks down.

SUMMARY

A first aspect of the innovations herein provides a semiconductor device. The semiconductor device may include a semiconductor layer of a first conductivity type and a semiconductor layer of a second conductivity type. The semiconductor layer of the first conductivity type may have a first surface and a second surface. The second surface may be oppositely positioned to the first surface. The semiconductor layer of the second conductivity type may be in contact with the first surface of the semiconductor layer of the first conductivity type. The semiconductor layer of the first conductivity type may have a plurality of impurity concentration peaks that are differently positioned in a first direction. The first direction may extend from the first surface to the second surface. An integrated concentration obtained by integrating an impurity concentration value from (i) the first surface to (ii) a boundary between a first impurity concentration peak of the plurality of impurity concentration peaks that is the closest to the first surface and a second impurity concentration peak of the plurality of impurity concentration peaks that is the second closest to the first surface may be equal to or lower than a critical integrated concentration. The first surface may be a junction interface in the first direction between the semiconductor layer of the first conductivity type and the semiconductor layer of the second conductivity type.

An integrated concentration obtained by integrating the impurity concentration value in the first direction from the first surface to a boundary between the second impurity concentration peak and a third impurity concentration peak of the plurality of impurity concentration peaks that is the third closest to the first surface may be equal to or lower than the critical integrated concentration.

The semiconductor layer of the first conductivity type may have an impurity concentration peak for impurities other than protons at a position closer to the second surface than the third impurity concentration peak of the plurality of impurity concentration peaks.

An integrated concentration obtained by integrating the impurity concentration value in the first direction from the first surface to a boundary between the third impurity concentration peak and the impurity concentration peak for the impurities other than the protons may be equal to or lower than the critical integrated concentration.

An integrated concentration obtained by integrating the impurity concentration value in the first direction from the first surface to the third impurity concentration peak may be equal to or lower than the critical integrated concentration.

The semiconductor layer of the first conductivity type may have, between the second surface and the impurity concentration peak for the impurities other than the protons, an impurity concentration peak for second-conductivity-type impurities at which an impurity concentration is higher than at the impurity concentration peak for the impurities other than the protons.

A percentage of (i) a length from a front surface of the semiconductor layer of the second conductivity type that is oppositely positioned to the junction interface to a position of the first impurity concentration peak with respect to (ii) a length in the first direction of the semiconductor layer of the first conductivity type and the semiconductor layer of the second conductivity type may fall within a range of higher than 85% and lower than 89%. A percentage of (i) a length from the front surface to a position of the second impurity concentration peak with respect to (ii) the length in the first direction of the semiconductor layer of the first conductivity type and the semiconductor layer of the second conductivity type may fall within a range of higher than 89% and lower than 91%. A percentage of (i) a length from the front surface to a position of the third impurity concentration peak with respect to (ii) the length in the first direction of the semiconductor layer of the first conductivity type and the semiconductor layer of the second conductivity type may fall within a range of higher than 96% and lower than 98%. A percentage of (i) a length from the front surface to a position of the impurity concentration peak for the impurities other than the protons with respect to (ii) the length in the first direction of the semiconductor layer of the first conductivity type and the semiconductor layer of the second conductivity type may fall within a range of higher than 98% and lower than 100%.

The first impurity concentration peak may be positioned away from a front surface of the semiconductor layer of the second conductivity type that is oppositely positioned to the junction interface by a distance within a range of larger than 94 μm and smaller than 97 μm. The second impurity concentration peak may be positioned away from the front surface by a distance within a range of larger than 97 μm and smaller than 100 μm. The third impurity concentration peak may be positioned away from the front surface by a distance within a range of larger than 105 μm and smaller than 108 μm. The impurity concentration peak for the impurities other than the protons may be positioned away from the front surface by a distance within a range of larger than 108 μm and smaller than 110 μm.

A percentage of (i) a length from a front surface of the semiconductor layer of the second conductivity type that is oppositely positioned to the junction interface to a position of the first impurity concentration peak with respect to (ii) a length in the first direction of the semiconductor layer of the first conductivity type and the semiconductor layer of the second conductivity type may fall within a range of higher than 77% and lower than 81%. A percentage of (i) a length from the front surface to a position of the second impurity concentration peak with respect to (ii) the length in the first direction of the semiconductor layer of the first conductivity type and the semiconductor layer of the second conductivity type may fall within a range of higher than 81% and lower than 86%. A percentage of (i) a length from the front surface to a position of the third impurity concentration peak with respect to (ii) the length in the first direction of the semiconductor layer of the first conductivity type and the semiconductor layer of the second conductivity type may fall within a range of higher than 93% and lower than 97%. A percentage of (i) a length from the front surface to a position of the impurity concentration peak for the impurities other than the protons with respect to (ii) the length in the first direction of the semiconductor layer of the first conductivity type and the semiconductor layer of the second conductivity type may fall within a range of higher than 97% and lower than 100%.

The first impurity concentration peak may be positioned away from a front surface of the semiconductor layer of the second conductivity type that is oppositely positioned to the junction interface by a distance within a range of larger than 54 μm and smaller than 57 μm. The second impurity concentration peak may be positioned away from the front surface by a distance within a range of larger than 57 μm and smaller than 60 μm. The third impurity concentration peak may be positioned away from the front surface by a distance within a range of larger than 65 μm and smaller than 68 μm. The impurity concentration peak for the impurities other than the protons may be positioned away from the front surface by a distance within a range of larger than 68 μm and smaller than 70 μm.

The semiconductor device may further include a gate insulator film and a gate electrode. The gate insulator film may be formed as a trench at least in part of the semiconductor layer of the second conductivity type. The gate electrode may be in contact with the gate insulator film.

Donors at each of the first to third impurity concentration peaks may include donor complexes of hydrogen, vacancies and oxygen.

The summary clause does not necessarily describe all necessary features of the embodiments of the present invention. The present invention may also be a sub-combination of the features described above.

DESCRIPTION OF THE EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

As used herein, the letters "n" and "p" respectively mean that the electrons and holes are majority carriers. In addition, the letters "n" and "p" may be accompanied by the superscript "+" and "−," which respectively mean a higher carrier concentration than when not added and a lower carrier concentration than when not added. In the examples described herein, a first conductivity type means the n-type and a second conductivity type means the p-type. In other examples, however, the first conductivity type may mean the p-type and the second conductivity type may mean the n-type.

Figure 1:
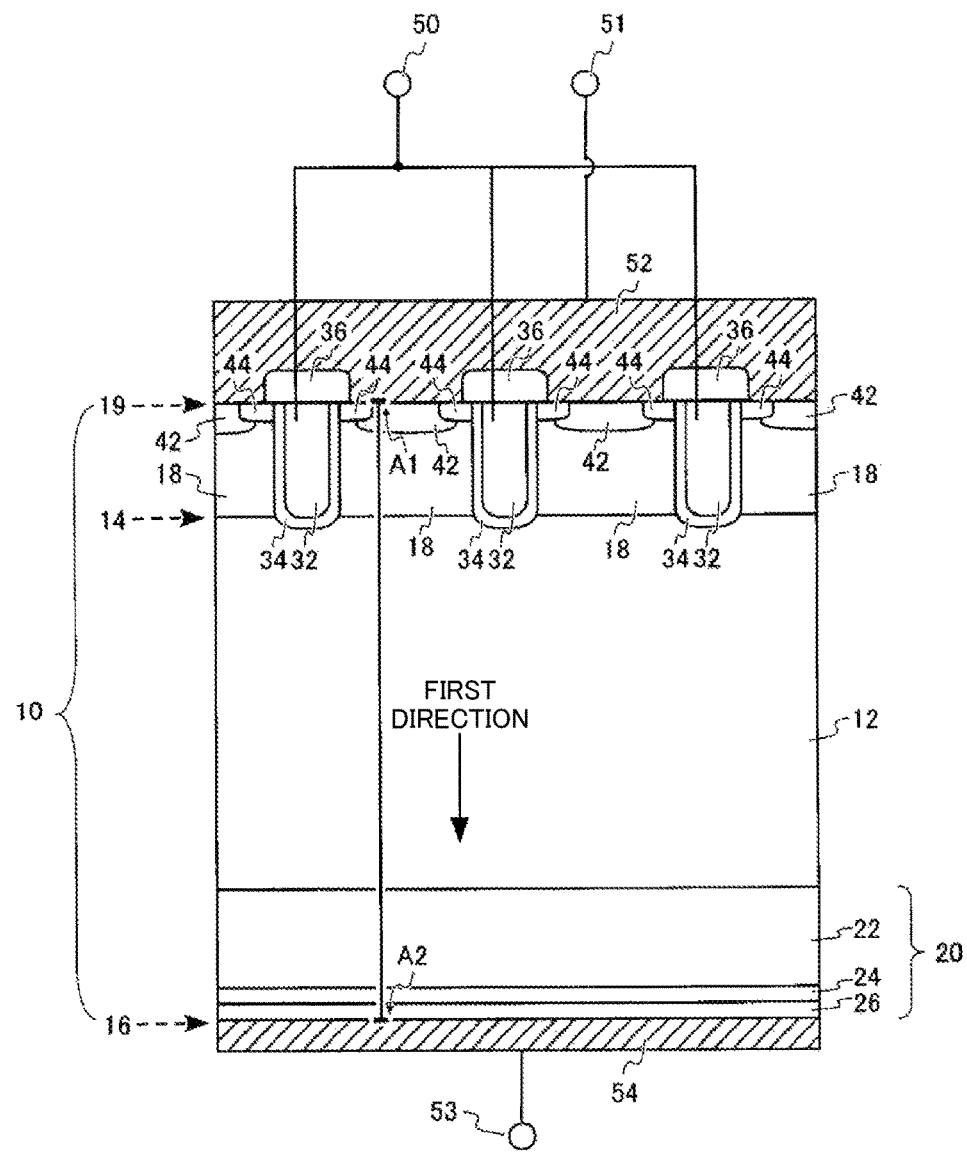
FIG. 1 shows the cross-section of an IGBT 100 relating to an embodiment of the present invention.

FIG. 1 shows the cross-section of an IGBT 100 relating to an embodiment of the present invention. The IGBT 100, which is shown as an exemplary semiconductor device, includes a semiconductor substrate 10, an emitter electrode 52 and an interlayer dielectric film 36 that are provided on and in contact with a front surface 19 of the semiconductor substrate 10, and a collector electrode 54 that is provided on and in contact with the back surface of the semiconductor substrate 10.

The semiconductor substrate 10 includes an n⁻-type drift layer 12, which is shown as an exemplary semiconductor layer of the first conductivity type, and a p-type base layer 18, which is shown as an exemplary semiconductor layer of the second conductivity type. The drift layer 12 has a first surface 14 and a second surface 16. The first surface 14 is also referred to as a pn junction interface between the drift layer 12 and the base layer 18. The second surface 16 is oppositely positioned to the first surface 14 and also referred to as the back surface of the above-mentioned semiconductor substrate 10. The base layer 18 is provided on and in contact with the first surface 14. The base layer 18 has a front surface 19 that is oppositely positioned to the first surface 14 (the junction interface). As shown in FIG. 1, a contact region 42 and an emitter region 44 are provided in the base layer 18 on the front surface 19 side. The front surface 19 is also the front surface of the semiconductor substrate 10.

The drift layer 12 has therein a semiconductor layer 20 on the second surface 16 side. The semiconductor layer 20 is formed by implanting impurities through the second surface 16 of the drift layer 12. The semiconductor layer 20 has therein a plurality of impurity concentration peaks that are positioned differently in a first direction. As used herein, the term "peak" means the peak of the concentration of the first- or second-conductivity-type impurities. The semiconductor layer 20 includes a FS layer 22 of the first conductivity type, a buffer layer 24 of the first conductivity type, and a collector layer 26 of the second conductivity type. The FS layer 22, the buffer layer 24 and the collector layer 26 are arranged in the stated order in the first direction. The first direction is directed from the first surface 14 to the second surface 16. In other words, the first direction may be considered to be the thickness direction of the semiconductor substrate 10 directed from the emitter electrode 52 to the collector electrode 54.

The FS layer 22 of the first conductivity type has therein three impurity concentration peaks that are positioned differently in the first direction. In the present example, the FS layer 22 is capable of preventing the depletion layer from expanding further. To be specific, the FS layer 22 is capable of preventing the depletion layer, which starts to expand from the vicinity of the first surface 14, from reaching the second surface 16. In the present example, the FS layer 22 is a region doped with protons (H⁺) and having three impurity concentration peaks that result from the implantation of the protons (H⁺) and that are positioned differently in the first direction. The donors that form the impurity concentration peaks resulting from the implantation of the protons include compound defects of hydrogen (H) that is introduced as a result of the implantation of the protons, the vacancies (V) that are the crystal defects formed during the same implantation, and oxygen (O) that are originally present in the semiconductor substrate 10, in other words, donor complexes created by the VOH defects. The donor complexes created by the VOH defects are also referred to as hydrogen-related donors.

The buffer layer 24 of the first conductivity type is a layer having a higher concentration of impurities that produce the first conductivity type than the FS layer 22. In other words, in the present example, the FS layer 22 is of the n-type, and the buffer layer 24 is of the n⁺-type. The buffer layer 24 may be also capable of preventing the depletion layer from expanding further, like the FS layer 22. In the present example, the buffer layer 24 has a peak of the concentration of the first-conductivity-type impurities other than the protons. In the present example, the buffer layer 24 is a region doped with phosphorous (P). The buffer layer 24, however, may be alternatively a layer doped with protons (H⁻), in place of phosphorous (P), in order to achieve a higher impurity concentration than the FS layer 22.

The collector layer 26 of the second conductivity type is capable of supplying holes from the semiconductor substrate 10. The impurity concentration peak in the collector layer 26 is higher than the impurity concentration peak in the buffer layer 24. In the present example, the collector layer 26 is a region doped with boron (B).

The semiconductor substrate 10 further includes a gate electrode 32 of the trench type, a gate insulator film 34, an emitter region 44 of the first conductivity type, and a contact region 42 of the second conductivity type. The gate insulator film 34 is provided as a trench in at least part of the base layer 18. The gate electrode 32 is provided on and in contact with the gate insulator film 34.

Note that, in other examples, the IGBT 100 may include a gate electrode and a gate insulator film of the planar type. More electrons are introduced from the emitter electrode 52 into the collector electrode 54 when the trench gate technology is employed than when the planar gate technology is used. For this reason, the semiconductor layer 20 of the present example that is configured such that the concentration of the electric fields is reduced on the collector electrode 54 side by supplying the holes from the collector layer 26 produces stronger effects when the trench gate technology is used than when the planar gate technology is employed.

The gate electrode 32 is electrically disconnected from the emitter electrode 52 by an interlayer dielectric film 36 that is provided on and in contact with the front surface 19. A voltage is applied to a plurality of gate electrodes 32 through a gate terminal 50. An emitter terminal 51 is electrically connected to the emitter electrode 52 and a collector terminal 53 is electrically connected to the collector electrode 54.

When the gate electrode 32 is turned on, a channel region is formed in the base layer 18 and in the vicinity of the gate electrode 32. Here, if an appropriate difference in potential is formed between the emitter electrode 52 and the collector electrode 54, currents flow from the collector electrode 54 to the emitter electrode 52. The emitter region 44 is configured to provide a path of currents connected to the channel forming region.

The contact region 42 is configured to provide a low contact resistance between the emitter electrode 52 and the semiconductor substrate 10. When currents flow through the IGBT 100, the currents flow from the collector electrode 54 to the emitter electrode 52 through the emitter region 44 and the contact region 42.

Figure 2A:
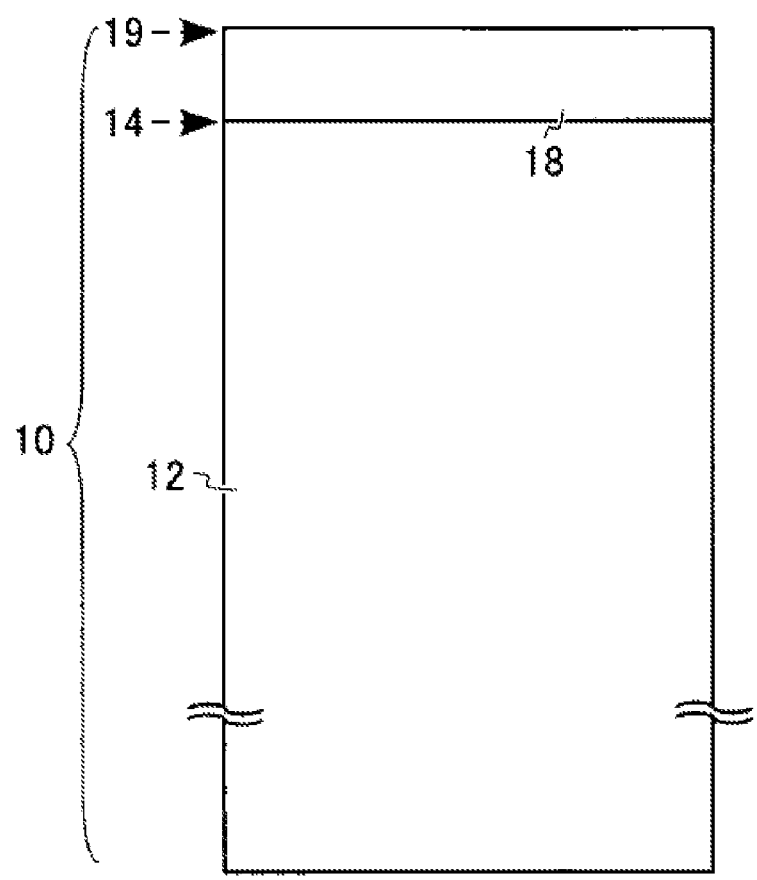
FIGS. 2A to 2D show the manufacturing process of the IGBT 100.

FIGS. 2A to 2D show the manufacturing process of the IGBT 100. FIG. 2A shows a step of forming the base layer 18 on the front surface 19 of the semiconductor substrate 10 including the drift layer 12. The semiconductor substrate 10 may be a n-type monocrystalline substrate provided by the float zone (FZ) technique, a monocrystalline substrate provided by the Czochralski (Cz) technique or a monocrystalline substrate provided by the magnetic field applied Czochralski (MCZ) technique. The semiconductor substrate 10 may have a thickness of 100 μm or more and a specific resistance of 50 Ωcm or more. In the present example, the semiconductor substrate 10 has a thickness of 110 μm and a specific resistance of 70 Ωcm or more.

Figure 2B:
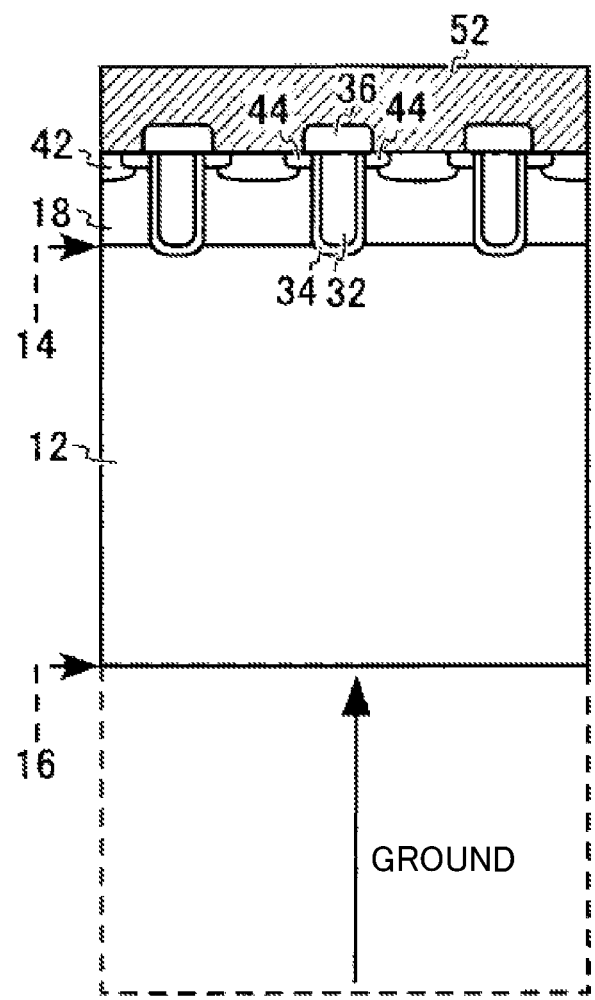

FIG. 2B shows a step of forming the gate electrode 32, the gate insulator film 34, the contact region 42 and the emitter region 44, and subsequently forming the interlayer dielectric film 36 and the emitter electrode 52 on the front surface 19 of the semiconductor substrate 10. The gate electrode 32 may be made of polysilicon and the gate insulator film 34 may be made of silicon oxide. The contact region 42 may be a region doped with the second-conductivity-type impurities such as boron (B). The emitter region 44 may be a region doped with the first-conductivity-type impurities such as arsenide (As) or phosphorous (P). The interlayer dielectric film 36 may be made of silicon oxide and the emitter electrode 52 may be made of an alloy of aluminum and silicon (Al—Si).

Figure 2C:
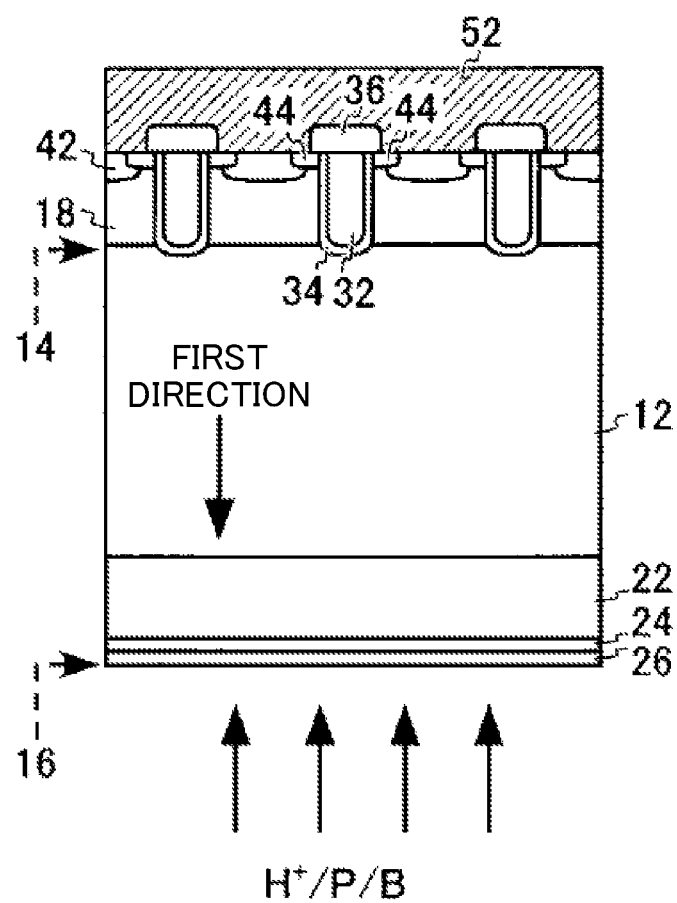

FIG. 2C shows a step of forming the FS layer 22, the buffer layer 24 and the collector layer 26 by implanting impurities through the second surface 16 of the drift layer 12. According to the present example, in the step shown in FIG. 2C, protons (H$^+$) are first implanted to form the FS layer 22 having three peaks that are differently positioned in the first direction. The positions of the impurity concentration peaks can be controlled by regulating the accelerating voltage for the protons.

In the present example, the protons (H$^+$) are implanted with the dosage being set to 1.0E13 cm$^{-2}$ and the accelerating voltage being set to 1.00 MeV in order to form a first peak at a position away from the second surface 16 by 15 µm. Furthermore, the protons (H$^+$) are implanted with the dosage being set to 7.0E12 cm$^{-2}$ and the accelerating voltage being set to 0.80 MeV in order to form a second peak at a position away from the second surface 16 by 10 µm. In addition, the protons (H$^+$) are implanted with the dosage being set to 1.0E13 cm$^{-2}$ and the accelerating voltage being set to 0.40 MeV in order to form a third peak at a position away from the second surface 16 by 4.2 µm. Note that, however, positions at which the peaks are actually formed after annealing for activation are slightly off the above-described originally designated positions. Here, the letter "E" means powers of 10 and 1.0E13 means $1.0\times10^{13}$, for example.

After the FS layer 22 is formed, phosphorous (P) is implanted to form the buffer layer 24. In the present example, phosphorous (P) are implanted with the dosage being set to 1.7E12 cm$^{-2}$ and the accelerating voltage being set to 640 keV in order to form a peak at a position away from the second surface 16 by 0.7 µm. After the buffer layer 24 is formed, boron (B) is implanted with the dosage of 2.0E13 cm$^{-2}$ to form the collector layer 26.

Figure 2D:
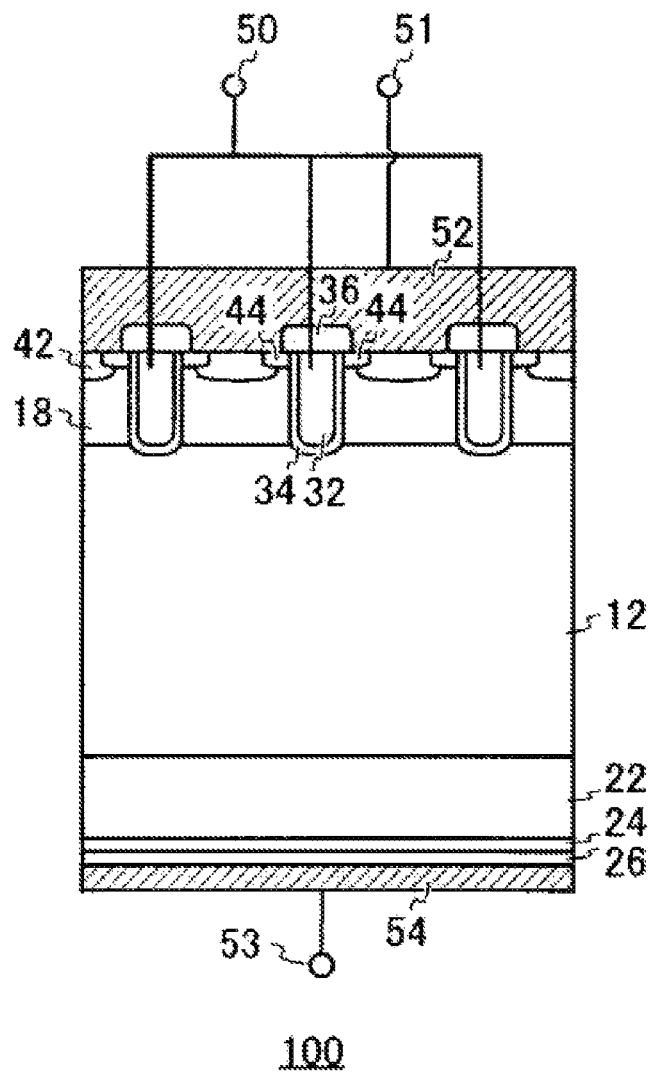

FIG. 2D shows a step of forming the collector electrode 54 that is in contact with the second surface 16. The collector electrode 54 may be formed by stacking titanium (Ti), nickel (Ni) and gold (Au) in the stated order. After this, the gate terminal 50, the emitter terminal 51 and the collector terminal 53 are provided. In this manner, the IGBT 100 is completed.

Figure 3:
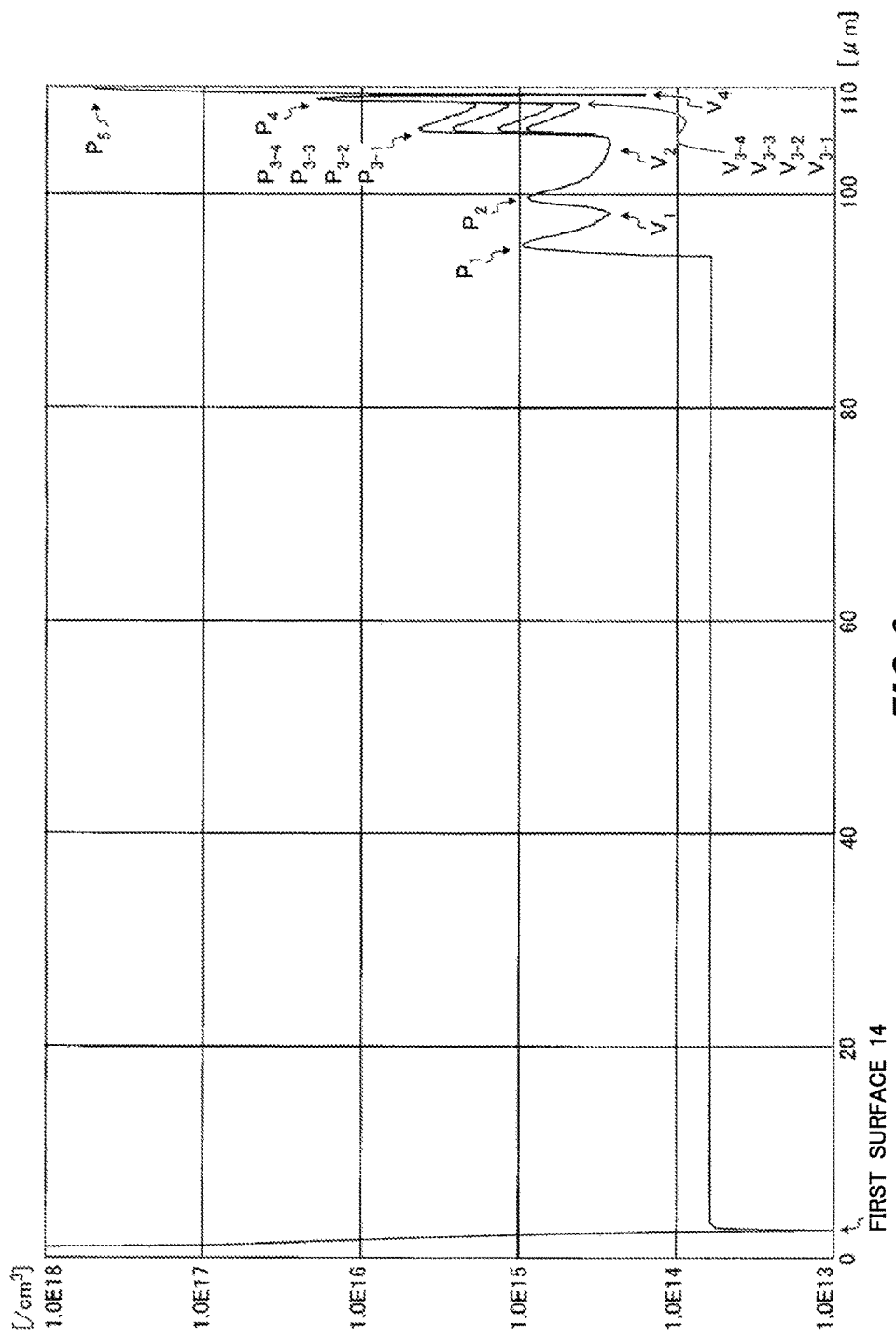
FIG. 3 shows impurity concentration peaks ($P_x$) and boundaries ($V_y$) between the impurity concentration peaks in the region between A1 and A2 in a first embodiment.

FIG. 3 shows impurity concentration peaks ($P_x$) and boundaries ($V_y$) between the impurity concentration peaks in the region between A1 and A2 in a first embodiment. As used herein, $P_x$ (x=1 to 5) denotes the impurity concentration peak. At the peak $P_x$, the impurity concentration takes a local maximum value. The position and height of the peak $P_x$ can be controlled by varying the accelerating voltage for the impurities to be implanted and the impurity concentration. Here, $V_y$ (y=1 to 4) denotes the boundary between two peaks $P_x$. At the boundary $V_y$, the impurity concentration takes a minimum value between two peaks $P_x$.

In FIG. 3, the vertical axis represents the impurity concentration [/cm$^3$], specifically the net impurity concentration (net doping) obtained by adding together the first- and second-conductivity-type impurity concentrations. FIG. 3 shows the impurity concentration observed between A1 and A2 indicated in FIG. 1. The horizontal axis represents the position in the semiconductor substrate 10 defined in the first direction. A position 0 µm denotes the front surface 19 and a position 110 µm denotes the second surface 16. Between the position 0 µm and the position 10 µm, the first surface 14 of the drift layer 12 is positioned.

The present example shows the impurity doping pattern in the IGBT 100 having a breakdown voltage of 1,200 V.

In the present example, A1-A2 denotes the region extending in the first direction from the front surface 19 to the second surface 16.

As used herein, a first peak $P_1$ means a first one of a plurality of impurity concentration peaks that is the closest to the first surface 14. Likewise, a second peak $P_2$, a third peak $P_3$ and a fourth peak $P_4$ respectively denote the impurity concentration peaks that are the second, third and fourth closest to the first surface 14. Furthermore, a fifth peak $P_5$ denotes the peak that is the closest to the second surface 16. In the present example, the peaks $P_1$ to $P_3$ are the proton (H$^+$) concentration peaks in the concentration distribution. The fourth peak $P_4$, which is positioned closer to the second surface 16 than the third peak $P_3$ is, is a concentration peak of impurities other than the protons. The fifth peak $P_5$ is positioned between the second surface 16 and the fourth peak $P_4$ and has a higher impurity concentration than the fourth peak $P_4$.

A boundary $V_1$ is positioned between the peak $P_1$ and the peak $P_2$. Likewise, a boundary $V_2$ is positioned between the peak $P_2$ and the peak $P_3$, a boundary $V_3$ is positioned between the peak $P_3$ and the peak $P_4$, and a boundary $V_4$ is positioned between the peak $P_4$ and the peak $P_5$.

In the present example, first to fourth doping patterns are observed, which are numbered in the ascending order of the impurity concentration at the peak $P_3$. Note that the integrated concentration, which will be described later, decreases in the order of the first to fourth doping patterns. Although having different impurity concentrations at the peak $P_3$, the first to fourth doping patterns all have the peak $P_3$ at the same position.

FIG. 3 shows four different types of doping patterns in the single graph. The several different types of doping patterns correspond to different IGBTs 100. A single completed IGBT 100 has a single type of doping pattern. When the total dosage for the first doping pattern is represented as 1, the total dosages of the second, third and fourth doping patterns are respectively represented as 1.4, 2.6, and 4.5. The differences in total dosage are particularly eminently seen at the third peak and in the vicinity of the third boundary.

The four different types of first to fourth doping patterns have different impurity concentrations at the third peaks $P_{3-1}$, $P_{3-2}$, $P_{3-3}$ and $P_{3-4}$ and in the vicinity of the third boundaries $V_{3-1}$, $V_{3-2}$, $V_{3-3}$ and $V_{3-4}$. The four different types of doping patterns, however, coincide with each other in the remaining regions. For example, in the region from the position 0 µm to the position 100 µm, the four different types of doping patterns coincide with each other. For example, the first to fourth doping patterns coincide with each other at the peak $P_4$, the boundary $V_4$ and the peak $P_5$. The impurity concentrations at the third peaks increase in the order of the third peaks $P_{3-1}$, $P_{3-2}$, $P_{3-3}$ and $P_{3-4}$, and the impurity concentrations at the third boundaries increase in the order of the third boundaries $V_{3-1}$, $V_{3-2}$, $V_{3-3}$ and $V_{3-4}$.

Figure 4:
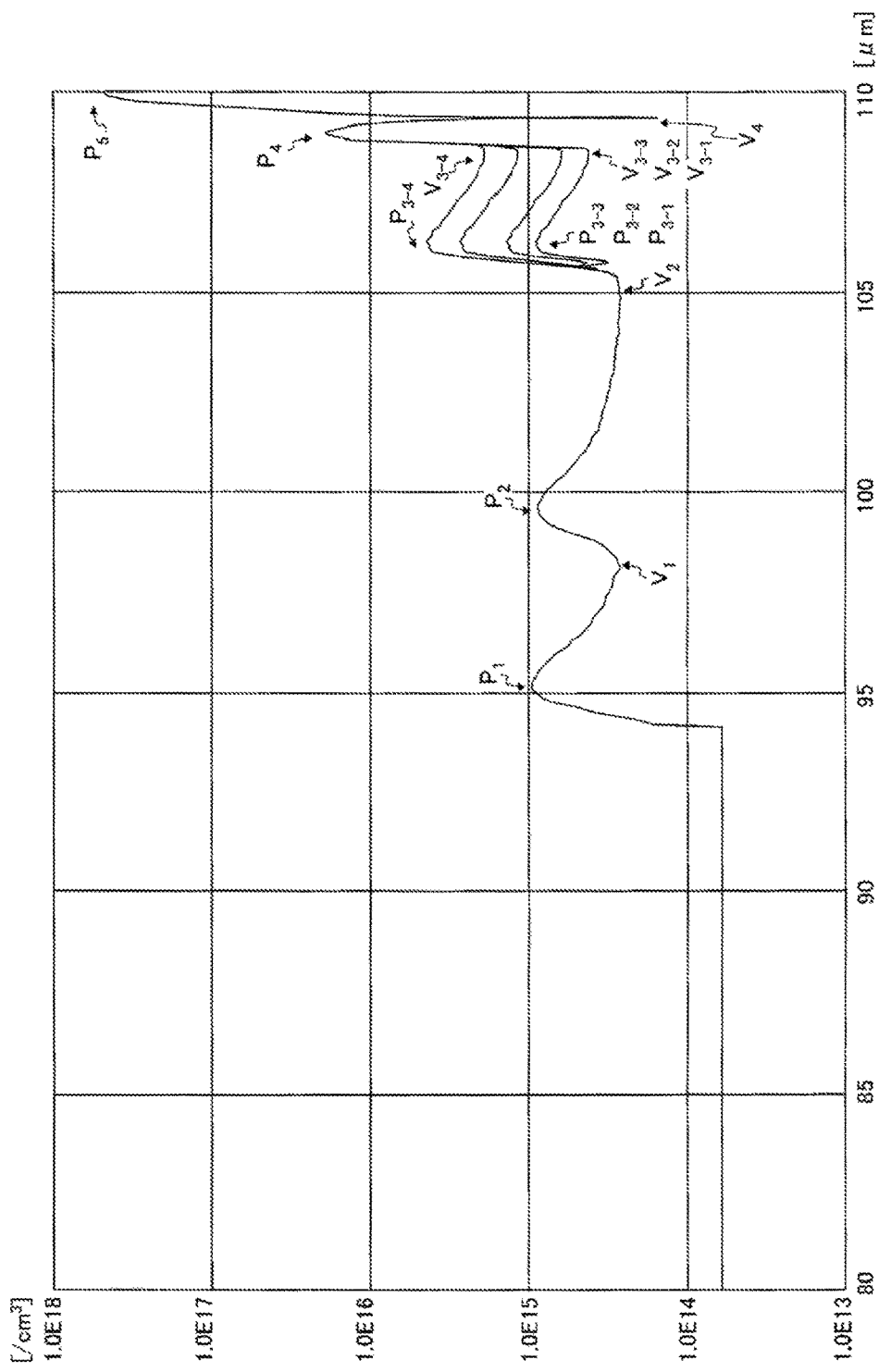
FIG. 4 is an enlarged view showing the region from a position of 80 μm to a position of 110 μm indicated in FIG. 3.

FIG. 4 is an enlarged view showing the region from a position 80 µm to a position 110 µm indicated in FIG. 3. As can be seen from FIG. 4, the four different types of doping patterns perfectly coincide with each other in the region excluding the region from the second boundary $V_2$ to the fourth peak $P_4$.

Between the second boundary $V_2$ and the third peak $P_{3-1}$ of the first doping pattern, impurity concentration local maximum and minimum values that are lower than the impurity concentration of the third peak $P_{3-1}$ are observed. However, the local maximum and minimum values of the impurity concentration between the second boundary $V_2$ and the third peak $P_{3-1}$ are not intentionally formed by regulating the accelerating voltage for the impurities to be implanted and the impurity concentration. Therefore, these are not considered to be a peak P and a boundary V herein.

In the present example, the position of the peak $P_1$ falls within the range of more than 94 μm and less than 97 μm. The position of the peak $P_2$ falls within the range of more than 97 μm and less than 100 μm. The position of the peak $P_3$ falls within the range of more than 105 μm and less than 108 μm. The position of the peak $P_4$ falls within the range of more than 108 μm and less than 110 μm.

In the present example, the above-mentioned ranges can be also expressed in the following manner, when L denotes the substrate length or the length of the drift layer 12 and the base layer 18 in the first direction. The percentage of the length from the position 0 μm to the position of the peak $P_1$ with respect to the substrate length L falls within the range of higher than 85% and lower than 89%. The percentage of the length from the position 0 μm to the position of the peak $P_2$ with respect to the substrate length L falls within the range of higher than 89% and lower than 91%. The percentage of the length from the position 0 μm to the position of the peak $P_3$ with respect to the substrate length L falls within the range of higher than 96% and lower than 98%. The percentage of the length from the position 0 μm to the position of the peak $P_4$ with respect to the substrate length L falls within the range of higher than 98% and lower than 100%.

Figure 5:
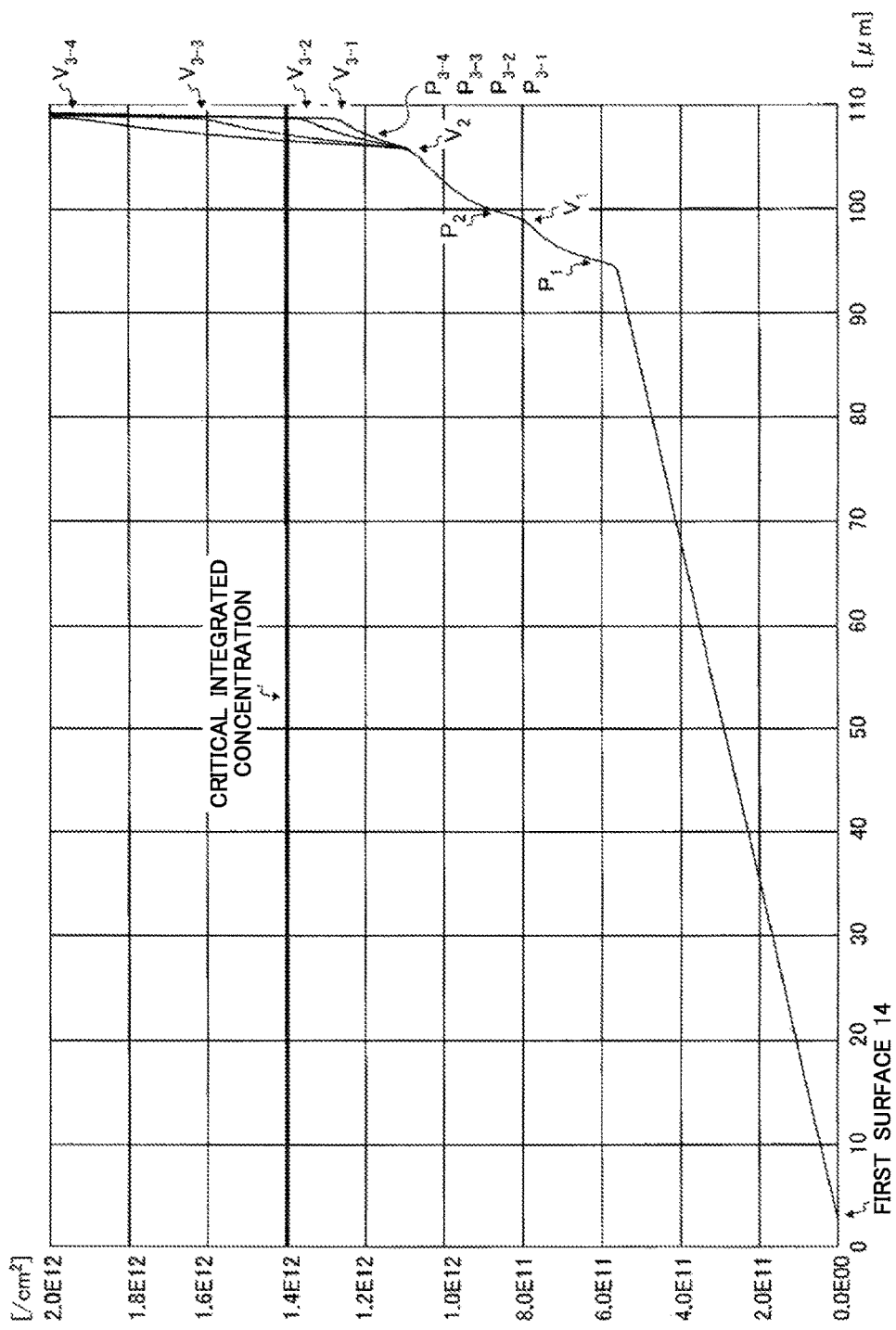
FIG. 5 shows the relation between the impurity concentration peaks ($P_x$) and a critical integrated concentration in the region between A1 and A2 in the first embodiment.

FIG. 5 shows the relation between the impurity concentration peaks ($P_x$) and the critical integrated concentration in the region between A1 and A2 in the first embodiment. The vertical axis represents the integrated concentration [/cm²] and the horizontal axis represents the position in the semiconductor substrate 10 defined in terms of the first direction, as in FIGS. 3 and 4. In the present example, the graph showing the values in the vicinity of the position of 110 μm is omitted due to the scaling reasons.

As used herein, the term "integrated concentration" refers to the value obtained by integrating the impurity concentration value in the first direction from the first surface 14, which is the junction interface between the drift layer 12 and the base layer 18, to a specific position in the drift layer 12. Furthermore, as used herein, the integrated impurity concentration value reaches a critical integrated concentration at the specific position if a forward bias is applied between the collector electrode 54 and the emitter electrode 52, the maximum value of the electric field strength reaches the critical electric field strength, avalanche breakdown occurs, and depletion occurs in the region extending in the first direction from the first surface 14 to the specific position in the drift layer 12. The application of the forward bias between the collector electrode 54 and the emitter electrode 52 in the IGBT 100 means that the potential of the collector electrode 54 is higher than the potential of the emitter electrode 52.

The application of the forward bias causes depletion to occur in the drift layer 12 down to the specific position at which the critical integrated concentration is reached, but the depletion does not occur in the region beyond the specific position in the first direction. In the present example, the position in the drift layer 12 at which the critical integrated concentration is reached can be controlled by regulating the positions of the peaks in the FS layer 22 (the peaks $P_1$ to $P_3$) of the four doping patterns. The critical integrated concentration may fall within the range from 1.2E12 /cm² to 2.0E12 /cm². In the present example, the critical integrated concentration is approximately 1.4E12 /cm².

In the present example, the integrated concentration obtained by integrating the impurity concentration value in the first direction from the first surface 14 to the boundary $V_1$ is equal to or lower than the critical integrated concentration in the first to fourth doping patterns. In addition, the integrated concentration obtained by integrating the impurity concentration value in the first direction from the first surface 14 to the boundary $V_2$ is equal to or lower than the critical integrated concentration in the first to fourth doping patterns.

In the present example, the integrated concentration obtained by integrating the impurity concentration value in the first direction from the first surface 14 to the boundary $V_{3-1}$ is equal to or lower than the critical integrated concentration in the first doping pattern. Also, the integrated concentration obtained by integrating the impurity concentration value in the first direction from the first surface 14 to the boundary $V_{3-2}$ is equal to or lower than the critical integrated concentration in the second doping pattern. In the third and fourth doping patterns, however, the integrated concentration obtained by integrating the impurity concentration value in the first direction from the first surface 14 to the boundary $V_{3-3}$ or $V_{3-4}$ exceeds the critical integrated concentration. In the second doping pattern, the integrated concentration obtained by integrating the impurity concentration value in the first direction from the first surface 14 to the peak $P_{3-2}$ is equal to or lower than the critical integrated concentration.

Figure 6:
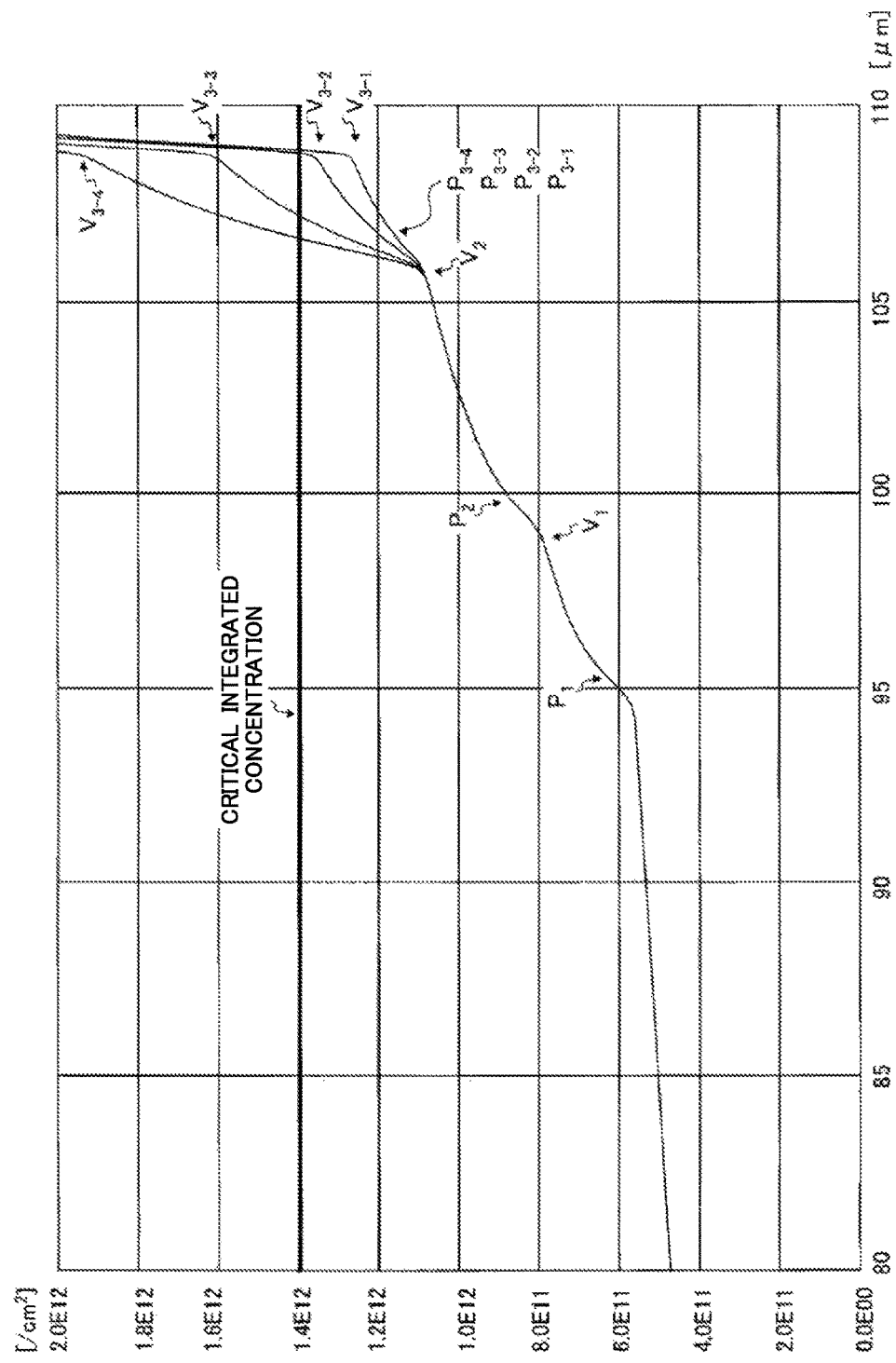
FIG. 6 is an enlarged view showing the region from a position of 80 μm to a position of 110 μm indicated in FIG. 5.

FIG. 6 is an enlarged view showing the region from a position of 80 μm to a position of 110 μm indicated in FIG. 5. In the present example, the three peaks $P_1$, $P_2$ and $P_3$ are present in the FS layer 22. At the first peak $P_1$ in the FS layer 22, the critical integrated concentration is not reached. Thus, the FS layer 22 can be positioned relatively closer to the emitter electrode 52 and have a relatively higher concentration. This can contribute to the reduction in oscillation that may occur at the time of switching. In the present example, the critical integrated concentration is reached in the FS layer 22 or buffer layer 24. Thus, the FS layer 22 or buffer layer 24 can prevent the depletion layer from expanding further.

Furthermore, in the present example, the buffer layer 24 (the peak $P_4$) has a higher concentration than the FS layer 22 and the collector layer 26 (the peak $P_5$) has a higher concentration than the buffer layer 24. While the FS layer 22 has an impurity concentration of 1.0E14 to 1.0E16, the impurity concentration at the peak $P_4$ is 1.0E16 to 1.0E17, and the impurity concentration at the peak $P_5$ is 1.0E17 to 1.0E18. Thus, the peaks $P_4$ and $P_5$ are not indicated in FIG. 6. In the present example, the buffer layer 24 and the collector layer 26 can be configured to control the carrier implantation characteristics. For example, the collector layer 26 can contribute to improve the characteristics of implanting the holes into the drift layer 12. This enables the carriers to be fed to the depletion layer while the IGBT 100 is turned off, and can thus reduce the increase in electric field on the collector side. In this way, the large-current-induced short-circuit withstand capability can be improved. As described above, the structure of the present example can achieve both the goal of reducing the oscillation that may occur at the time of switching and the like and the goal of improving the large-current-induced short-circuit withstand capability and the like without requiring a trade-off therebetween.

In the present example, a test was conducted to examine the large-current-induced short-circuit withstand capability under such conditions that the collector voltage Vcc=680 V, the gate-on resistance Rgon=4.1Ω, the gate-off resistance Rgoff=20Ω, the gate input pulse duration=2 μs, the chip joining temperature Tj=25° C., and the gate-emitter potential Vge was gradually raised from 15 V. The IGBT 100 of the present example did not break down even if the collector-emitter current Ic=4,300 A/cm$^2$. Due to the limitations of the device, the currents were blocked from flowing when Ic=4,300 A/cm$^2$. The collector voltage Vcc indicates the voltage applied to the collector terminal 53. The gate-emitter potential Vge indicates the difference in potential between the gate terminal 50 and the emitter terminal 51. The collector-emitter current Ic indicates the current flowing between the collector terminal 53 and the emitter terminal 51.

In addition, in the present example, a test was conducted to examine the turn-off surge under such conditions that the collector voltage Vcc=870 V, the collector-emitter current Ice=300 A/cm$^2$, the gate-on resistance Rgon=1Ω, the gate-off resistance Rgoff=1Ω, the floating inductance Ls=70 [nH], the chip joining temperature Tj=25° C., and the gate-emitter potential Vge was turned off by lowering the potential from 15 V to 0 V. As for the IGBT 100 of the present example, the collector-emitter voltage Vce peaked at 1,125 V when the gate was turned off. This indicates that the voltage overshoot that may occur when the gate is turned off is lower than conventionally. In addition, the oscillation that may occur when the gate is turned off is also lower than conventionally.

Figure 7:
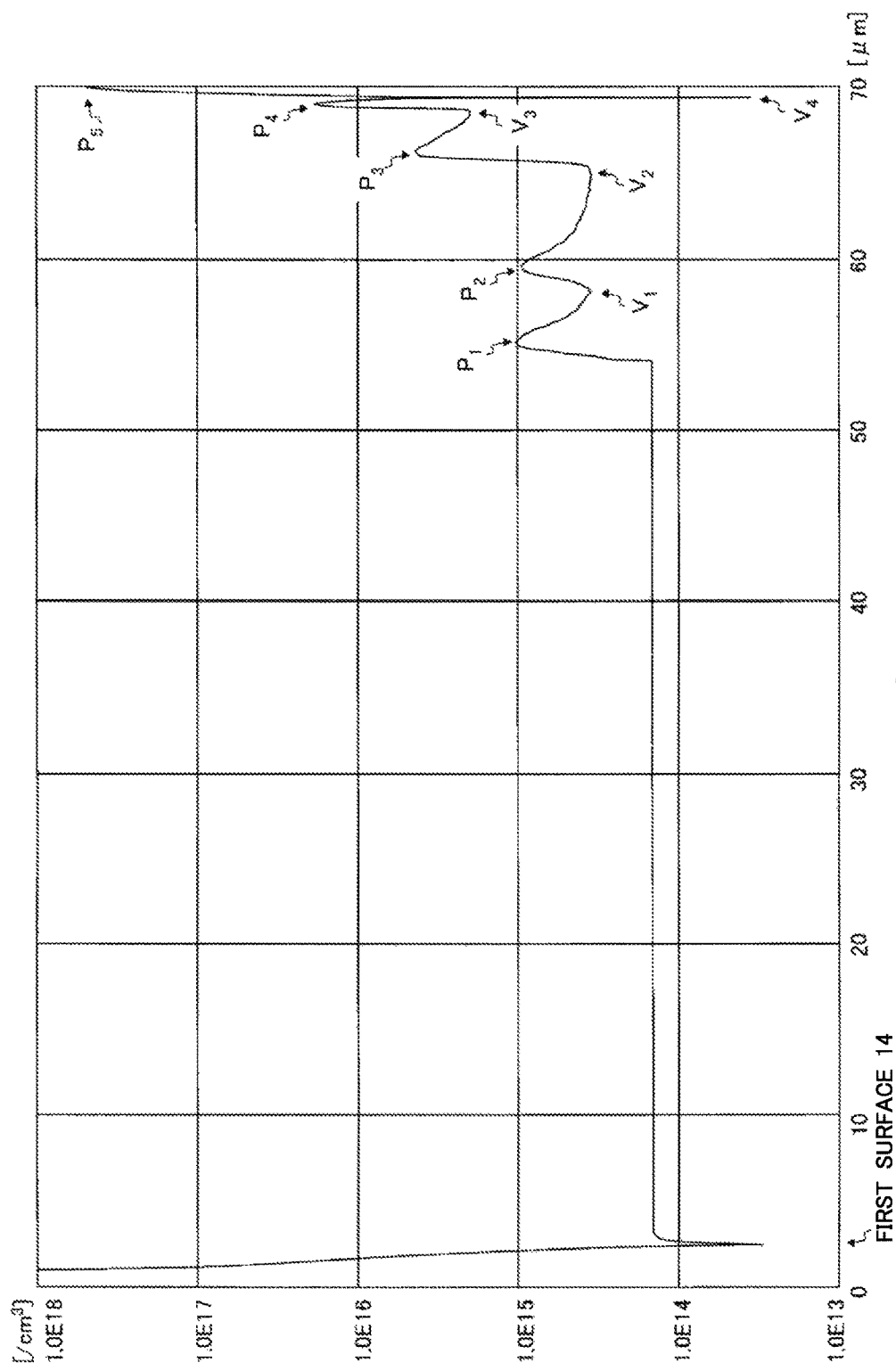
FIG. 7 shows impurity concentration peaks ($P_x$) and boundaries ($V_y$) between the impurity concentration peaks in the region between A1 and A2 in a second embodiment.

FIG. 7 shows the impurity concentration peaks ($P_x$) and the boundaries ($V_y$) between the impurity concentration peaks in the region between A1 and A2 in a second embodiment. The vertical and horizontal axes represent the same parameters as in FIG. 3. In the present example, the second surface 16 is equivalent to the position of 70 μm. In the IGBT 100 of the present example, the drift layer 12 has a smaller thickness than in the first embodiment and a breakdown voltage of 600 V. In the present example, the peaks $P_x$ are positioned differently than in the first embodiment. Except for this, the second embodiment may be the same as the first embodiment. In the present example, one type of doping pattern is shown.

Figure 8:
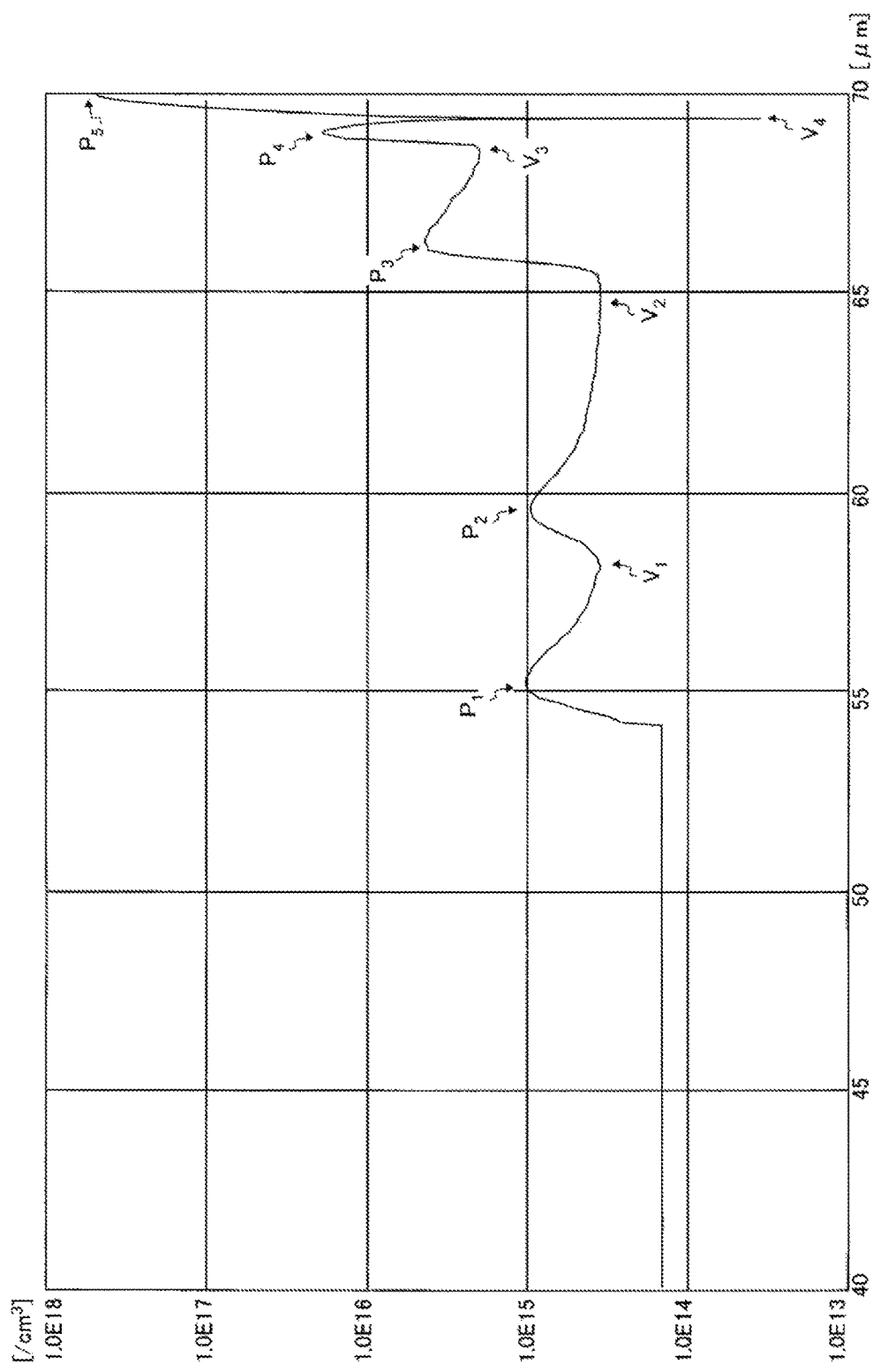
FIG. 8 is an enlarged view showing the region from a position of 40 μm to a position of 70 μm indicated in FIG. 7.

FIG. 8 is an enlarged view showing the region from a position of 40 μm to a position of 70 μm indicated in FIG. 7. In the present example, the position of the peak $P_1$ falls within the range of more than 54 μm and less than 57 μm. The position of the peak $P_2$ falls within the range of more than 57 μm and less than 60 μm. The position of the peak $P_3$ falls within the range of more than 65 μm and less than 68 μm. The position of the peak $P_4$ falls within the range of more than 68 μm and less than 70 μm.

In the present example, the above-mentioned ranges can be also expressed in the following manner, when L denotes the substrate length or the length of the drift layer 12 and the base layer 18 in the first direction. The percentage of the length from the position of 0 μm to the position of the peak $P_1$ with respect to the substrate length L falls within the range of higher than 77% and lower than 81%. The percentage of the length from the position of 0 μm to the position of the peak $P_2$ with respect to the substrate length L falls within the range of higher than 81% and lower than 86%. The percentage of the length from the position of 0 μm to the position of the peak $P_3$ with respect to the substrate length L falls within the range of higher than 93% and lower than 97%. The percentage of the length from the position of 0 μm to the position of the peak $P_4$ with respect to the substrate length L falls within the range of higher than 97% and lower than 100%.

Figure 9:
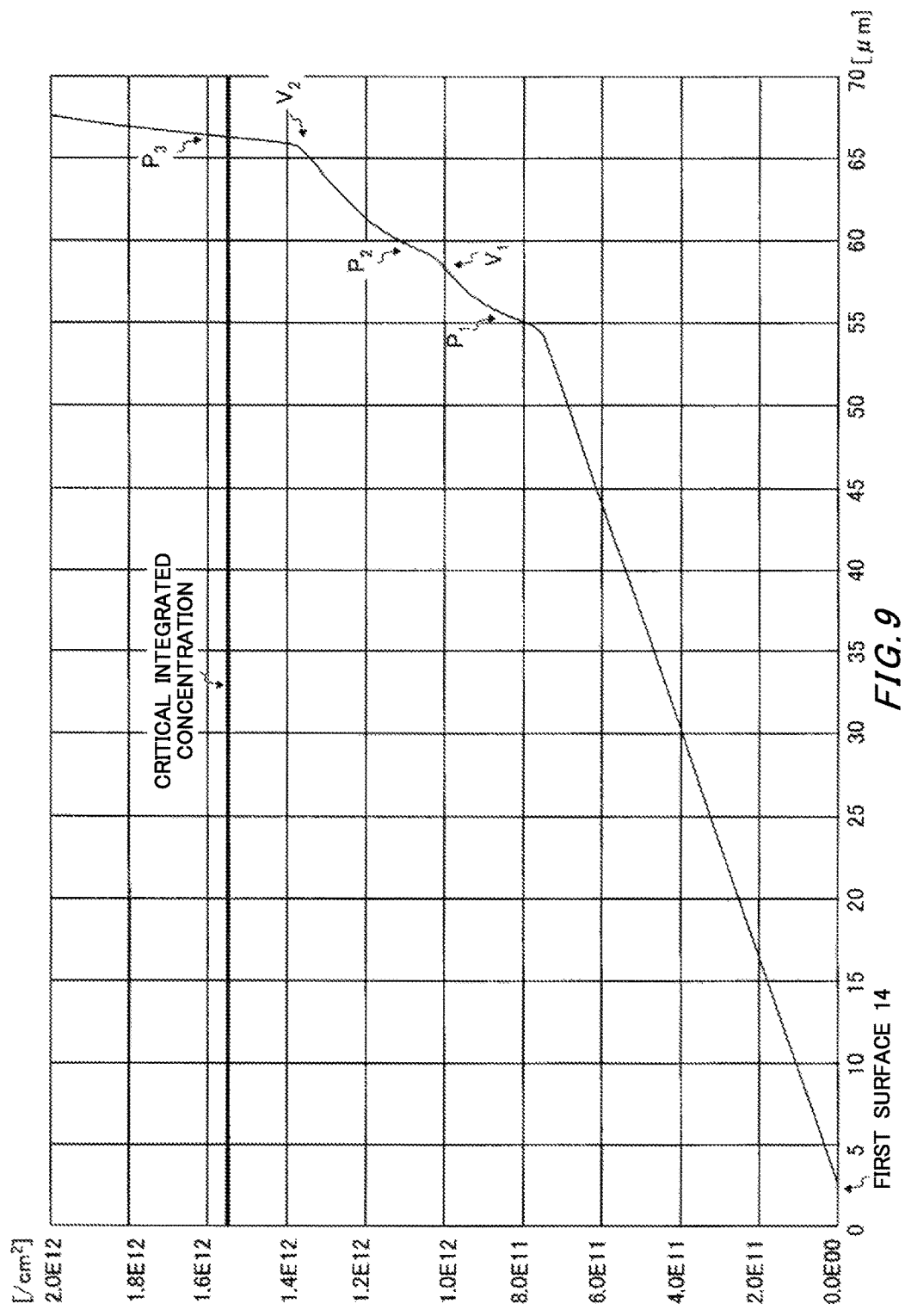
FIG. 9 shows the relation between the impurity concentration peaks ($P_x$) and a critical integrated concentration in the region between A1 and A2 in the second embodiment.

FIG. 9 shows the relation between the impurity concentration peaks ($P_x$) and the critical integrated concentration in the region between A1 and A2 in the second embodiment. In the present example, the integrated concentration obtained by integrating the impurity concentration value in the first direction from the first surface 14 to the boundary $V_1$ is equal to or lower than the critical integrated concentration. The integrated concentration obtained by integrating the impurity concentration value in the first direction from the first surface 14 to the peak $P_2$ is equal to or lower than the critical integrated concentration. In addition, the integrated concentration obtained by integrating the impurity concentration value in the first direction from the first surface 14 to the boundary $V_2$ is equal to or lower than the critical integrated concentration. However, the integrated concentration obtained by integrating the impurity concentration value in the first direction from the first surface 14 to peak $P_3$ exceeds the critical integrated concentration.

The manufacturing process of the IGBT 100 relating to the second embodiment is basically the same as in the first embodiment. The following lists the differences. In the second embodiment, the semiconductor substrate 10 may have a thickness of less than 100 μm and a specific resistance of less than 50 Ω/cm. In the present example, the semiconductor substrate 10 has a thickness of 70 μm and a specific resistance of 30 Ωcm. When the FS layer 22 is manufactured, protons are implanted with the dosage being set to 1.0E14 cm$^{-2}$ and the accelerating voltage being set to 0.40 MeV in order to form the third peak at a position away from the second surface 16 by 4.2 μm. Except for these, the second embodiment is the same as the first embodiment. The present example can produce the same effects as the first embodiment.

In the present example, a test was conducted to examine the large-current-induced short-circuit withstand capability under such conditions that the collector voltage Vcc=360 V, the gate-on resistance Rgon=1Ω, the gate-off resistance Rgoff=90Ω, the gate input pulse duration=2 μs, the chip joining temperature Tj=−40° C., and the gate-emitter potential Vge was gradually raised from 15 V. The IGBT 100 of the present example did not break down even if the collector-emitter current Ic=4,300 A/cm$^2$. Due to the limitations of the test equipment, the currents were blocked from flowing when Ic=4,300 A/cm$^2$.

In addition, in the present example, a test was conducted to examine the turn-off surge under such conditions that the collector voltage Vcc=410 V, the collector-emitter current Ice=310 A/cm$^2$, the gate-on resistance Rgon=3.9Ω, the gate-off resistance Rgoff=3.9Ω, the floating inductance Ls=70 nH, the chip joining temperature Tj=175° C., and the gate-emitter potential Vge was turned off by lowering the potential from 15 V to 0 V. As for the IGBT 100 of the present example, the collector-emitter voltage Vce peaked at approximately 700 V when the gate was turned off. The voltage overshoot that may occur when the gate is turned off is lower than conventionally. In addition, the oscillation that may occur when the gate is turned off is also lower than conventionally.

Furthermore, in the present example, a test was conducted to examine the turn-off surge under such conditions that the collector voltage Vcc=350 V, the collector-emitter current Ice=490 A/cm², and the other parameters were set in the same manner as in the above-described turn-off-surge test. As for the IGBT 100 of the present example, the collector-emitter voltage Vce peaked at approximately 750 V when the gate was turned off. The voltage overshoot that may occur when the gate is turned off is lower than conventionally. In addition, the oscillation that may occur when the gate is turned off is also lower than conventionally.

Figure 10:
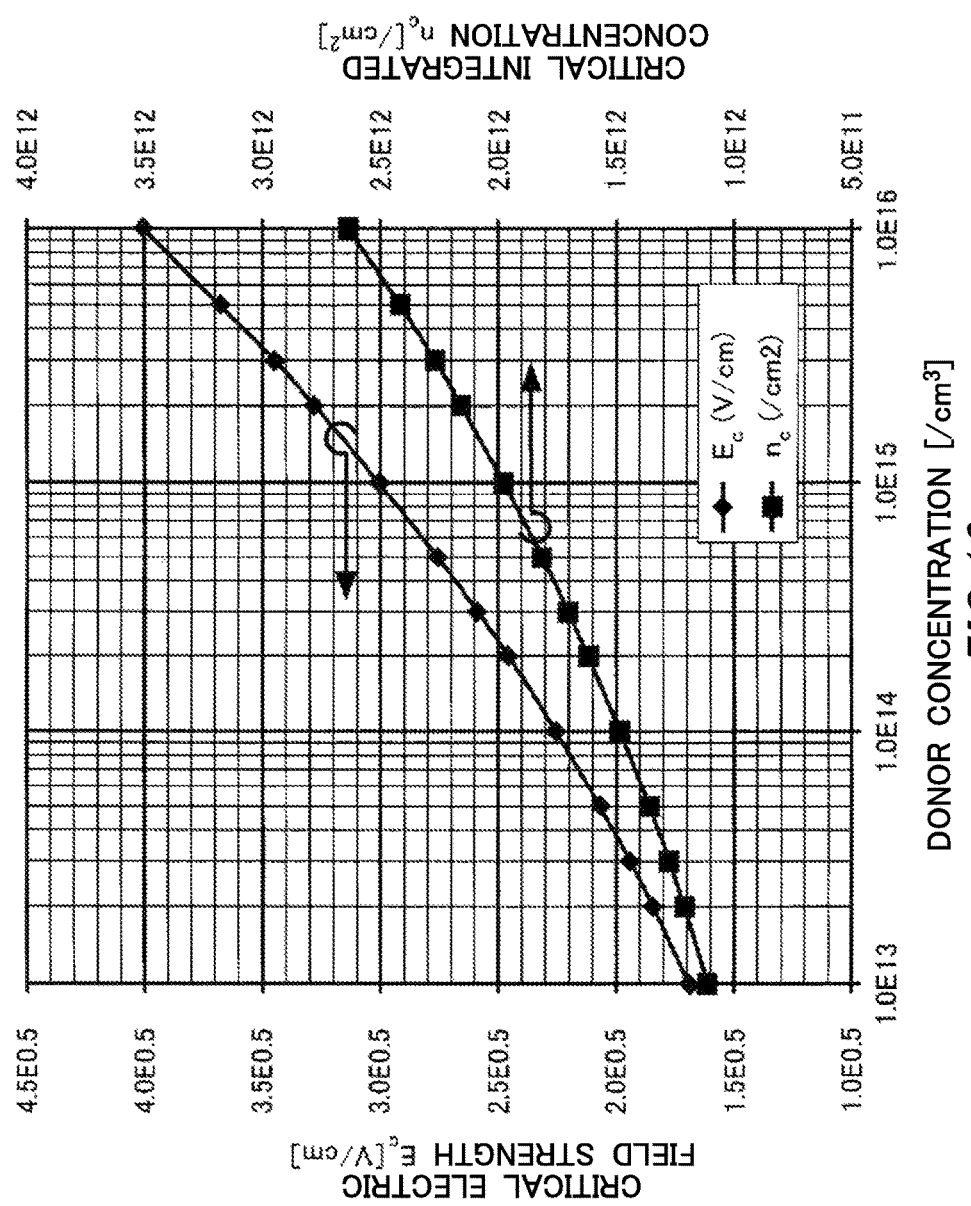
FIG. 10 shows the relation between a critical electric field strength $E_c$ and a donor concentration and the relation between a critical integrated concentration $n_c$ and the donor concentration.

FIG. 10 shows the relation between the critical electric field strength $E_c$ and the donor concentration and the relation between the critical integrated concentration $n_c$ and the donor concentration. The horizontal axis represents the donor concentration (the n-type impurity concentration) [/cm³], the left vertical axis represents the critical electric field strength $E_c$ [V/cm] and the right vertical axis represents the critical integrated concentration $n_c$ [/cm²]. The following describes that there is a correlation between the critical electric field strength $E_c$ and the critical integrated concentration $n_c$ in association with the donor concentration.

Here, a planar pn junction is considered. In particular, one-sided abrupt junction in which the concentration of the p-type layer is several orders of magnitude higher than the concentration of the n-type layer is discussed here. In the case of the one-sided abrupt junction, application of a reverse bias voltage to the pn junction can be considered to limit the expansion of the depletion layer to only the n-type layer. As a result of the application of the reverse bias voltage, the depletion layer expands and the electric field strength takes the maximum value in the vicinity of the pn junction. If the maximum value of the electric field strength reaches a predetermined value, the impact ionization causes avalanche breakdown.

In the first and second embodiments, the drift layer 12 is considered to be the n-type layer and the base layer 18 is considered to be the p-type layer. In addition, the application of the reverse bias voltage to the pn junction corresponds to application of a forward bias to the IGBT 100 in such a manner that the potential of the collector electrode 54 is higher than the potential of the emitter electrode 52.

The critical electric field strength indicates the value of the electric field strength that causes avalanche breakdown to occur. The avalanche breakdown is dependent on the component elements of the semiconductors, the impurities implanted into the semiconductors, and the concentrations of the impurities. When $N_D$ and $E_C$ respectively denote the donor concentration and the critical electric field strength and the impact ionization coefficient of silicon (Si) is used to calculate the ionization integral, the critical electric field strength $E_C$ is represented by Expression 1.

$$Ec=4010 \cdot (N_D)^{1/8} \qquad \text{Expression 1}$$

As can be seen from Expression 1, the critical electric field strength $E_C$ is fixed once the donor concentration $N_D$ is fixed. Poisson's equation can be expressed by Expression 2 when only the one-dimensional direction (assumed to be the x direction) is considered.

$$dE/dx=(q/\varepsilon_r\varepsilon_0)(p-n+N_D-N_A) \qquad \text{Expression 2}$$

In the expression, q denotes the elementary charge (1.602×10⁻¹⁹ C), $\varepsilon_0$ denotes the permittivity of vacuum or 8.854×10⁻¹⁴ F/cm, and $\varepsilon_r$ denotes the relative permittivity of the substance. Silicon has a relative permittivity $\varepsilon_r$=11.9. In addition, p denotes the hole concentration, n denotes the electron concentration and $N_A$ denotes the acceptor concentration. Since only the n-type layer of the one-sided abrupt junction is considered, no acceptors are present ($N_A$=0). In addition, a perfectly depleted layer is assumed where no holes or electrons are present (n=p=0). In this case, Expression 3 is obtained by integrating Expression 2 over the depth x.

$$E=(q/\varepsilon_r\varepsilon_0)\int N_D dx \qquad \text{Expression 3}$$

The position of the pn junction is expressed as the origin 0, and the position of the end of the depletion layer, in the n-type layer, that is oppositely positioned to the pn junction is expressed as $x_0$. Here, if the entire depletion layer is integrated from 0 to $x_0$, E in Expression 3 takes the maximum value in the electric field strength distribution. The maximum value in the electric field strength distribution is expressed as $E_m$, which is expressed by Expression 4.

$$E_m=(q/\varepsilon_r\varepsilon_0)\int_0^{x_0} N_D dx \qquad \text{Expression 4}$$

If the maximum value $E_m$ in the electric field strength distribution reaches the critical electric field strength $E_c$, Expression 4 is transformed into Expression 5.

$$E_c(\varepsilon_r\varepsilon_0/q)=\int_0^{x_0} N_D dx \qquad \text{Expression 5}$$

Both sides of Expression 5 indicate constant values. The right-hand side of Expression 5 denotes the perfectly depleted region in the n-type layer and is thus expressed as the critical integrated concentration $n_c$ in accordance with the definitions described herein. Thus, the following Expression 6 is obtained. Expression 6 shows that the critical integrated concentration $n_c$ is correlated to the critical electric field strength $E_c$. As explained here, the critical integrated concentration $n_c$ is a constant value correlated to the critical electric field strength $E_c$.

$$E_c(\varepsilon_r\varepsilon_0/q)=n_c \qquad \text{Expression 6}$$

In FIG. 10, it is assumed that the donor concentration $N_D$ has a uniform concentration distribution in the x direction in the n-type layer. Since the critical electric field strength $E_c$ is dependent on the donor concentration $N_D$ of the n-type layer (see Expression 5), the critical integrated concentration $n_c$ is also dependent on the donor concentration $N_D$ of the n-type layer. When the donor concentration $N_D$ falls within the range of 1×10¹³ to 1×10¹⁵ /cm³, the critical integrated concentration $n_c$ is within the range of 1.1×10¹² to 2.0×10¹² /cm². Judging from the fact that the donor concentration ranges over several orders of magnitude, the critical integrated concentration $n_c$ can be substantially considered to be a constant value.

In an exemplary case where the IGBT 100 has a breakdown voltage of 1,200 V as in the first embodiment, the critical integrated concentration $n_c$ can be evaluated to be approximately 1.4×10¹² /cm² based on Expression 6 when the donor concentration $N_D$ of the drift layer 12 is 6.1×10¹³ /cm³ (see FIGS. 3 and 4). In another exemplary case where the IGBT 100 has a breakdown voltage of 600 V as in the second embodiment, the critical integrated concentration $n_c$ can be evaluated to be approximately 1.55×10¹² /cm² based on Expression 6 when the donor concentration $N_D$ of the drift layer 12 is 1.4×10¹⁴ /cm³ (see FIGS. 7 and 8).

In the first and second embodiments, the position at which the critical integrated concentration $n_c$ is reached is controlled by regulating the positions of the peaks $P_x$. Since the critical integrated concentration $n_c$ is not reached at the peak $P_1$ in the FS layer 22, the FS layer 22 can be positioned relatively closer to the emitter electrode 52 and formed to have a relatively higher concentration. This can contribute to reduce the oscillation that may occur at the time of switching. This can also reduce the leakage currents and improve the RBSOA. In addition, by controlling the characteristics of implanting the holes using the collector layer 26, which has a higher impurity concentration than the FS layer 22, the critical electric field strength $E_c$ can be lowered at the position at which the critical integrated concentration $n_c$ is reached. As a result, the large-current-induced short-circuit withstand capability can be improved without requiring that the FS layer 22 is positioned closer to the collector electrode 54 than conventionally and that the FS layer 22 has a lower concentration than conventionally. Furthermore, the breakdown voltage can be also improved. As described above, the above examples do not require a trade-off between and can achieve both the goal of reducing the oscillation that may occur at the time of switching and the like and the goal of improving the large-current-induced short-circuit withstand capability.

Note that, when the IGBT 100 includes the FS layer 22 having therein a plurality of impurity concentration peaks as described herein, the drift layer 12 cannot have a uniform donor concentration $N_D$ in the FS layer 22. However, the critical integrated concentration $n_c$ denotes the integral in the first direction, in which the depletion layer expands. Thus, the fluctuations of the impurity concentration in the FS layer 22 are absorbed into the integral.

The above-described limitations on the critical total impurity amount can be also applied not only to silicon but also to wide-bandgap semiconductors such as silicon carbide (SiC), gallium nitride (GaN), diamond, and gallium oxide ($Ga_2O_3$). To be specific, the impact ionization coefficient of each substance can be used to derive Expression 1 and the relative permittivity of the used substance is substituted in Expression 2.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 . . . semiconductor substrate, 12 . . . drift layer, 14 . . . first surface, 16 . . . second surface, 18 . . . base layer, 19 . . . front surface, 20 . . . semiconductor layer, 22 . . . FS layer, 24 . . . buffer layer, 26 . . . collector layer, 32 . . . gate electrode, 34 . . . gate insulator film, 36 . . . interlayer dielectric film, 42 . . . contact region, 44 . . . emitter region, 50 . . . gate terminal, 51 . . . emitter terminal, 52 . . . emitter electrode, 53 . . . collector terminal, 54 . . . collector electrode, 100 . . . IGBT

What is claimed is:
1. A semiconductor device comprising:
a semiconductor substrate including a first semiconductor layer of a first conductivity type;
a second semiconductor layer of a second conductivity type provided over a front main surface of the first semiconductor layer of the first conductivity type; and
a third semiconductor layer of the second conductivity type provided at a rear main surface of the first semiconductor layer of the first conductivity type, wherein
the first semiconductor layer of the first conductivity type has a plurality of impurity concentration peaks in a field stop region that are differently positioned in a first direction extending toward the rear main surface,
an integrated concentration obtained by integrating an impurity concentration value of the first semiconductor layer in the first direction toward the rear main surface is equal to or lower than a critical integrated concentration $n_c$:

$$n_c = E_c(\varepsilon_r \varepsilon_0/q)$$

where Ec is a critical electric field strength, $\varepsilon_r$ denotes a relative permittivity of semiconductor, $\varepsilon_0$ denotes a permittivity of vacuum, and q denotes the elementary charge, and
an impurity concentration at a first impurity concentration peak of the plurality of impurity concentration peaks that is farthest from the rear main surface of the first semiconductor layer is higher than an impurity concentration at a second impurity concentration peak of the plurality of impurity concentration peaks that is second farthest from the rear main surface of the first semiconductor layer.

2. The semiconductor device as set forth in claim 1, wherein
an integrated concentration obtained by integrating the impurity concentration value of the first semiconductor layer in the first direction toward the rear main surface to a boundary between the second impurity concentration peak and a third impurity concentration peak of the plurality of impurity concentration peaks that is third closest to the front main surface is equal to or lower than the critical integrated concentration $n_c$.

3. The semiconductor device as set forth in claim 1, wherein
an integrated concentration obtained by integrating the impurity concentration value of the first semiconductor layer in the first direction toward the rear main surface to a boundary between the third impurity concentration peak and the impurity concentration peak for the impurities is equal to or lower than the critical integrated concentration $n_c$.

4. The semiconductor device as set forth in claim 1, wherein
an integrated concentration obtained by integrating the impurity concentration value of the first semiconductor layer in the first direction toward the rear main surface to the third impurity concentration peak is equal to or lower than the critical integrated concentration $n_c$.

5. The semiconductor device as set forth in claim 1, wherein
the semiconductor layer of the first conductivity type has, between the rear main surface and the impurity concentration peak for the impurities, an impurity concentration peak for second-conductivity-type impurities at which an impurity concentration is higher than at the impurity concentration peak for the impurities.

6. The semiconductor device as set forth in claim 1, wherein
a percentage of (i) a length from a front surface of the semiconductor layer of the second conductivity type that is oppositely positioned to a junction interface to a position of the first impurity concentration peak with respect to (ii) a length in the first direction of the semiconductor layer of the first conductivity type and the semiconductor layer of the second conductivity type falls within a range of higher than 85% and lower than 89%,
a percentage of (i) a length from the front surface to a position of the second impurity concentration peak with respect to (ii) the length in the first direction of the semiconductor layer of the first conductivity type and the semiconductor layer of the second conductivity type falls within a range of higher than 89% and lower than 91%,
a percentage of (i) a length from the front surface to a position of the third impurity concentration peak with respect to (ii) the length in the first direction of the semiconductor layer of the first conductivity type and the semiconductor layer of the second conductivity type falls within a range of higher than 96% and lower than 98%, and
a percentage of (i) a length from the front surface to a position of the impurity concentration peak for the impurities with respect to (ii) the length in the first direction of the semiconductor layer of the first conductivity type and the semiconductor layer of the second conductivity type falls within a range of higher than 98% and lower than 100%.

7. The semiconductor device as set forth in claim 1, wherein
the first impurity concentration peak is positioned away from a front surface of the semiconductor layer of the second conductivity type that is oppositely positioned to a junction interface by a distance within a range of larger than 94 μm and smaller than 97 μm,
the second impurity concentration peak is positioned away from the front surface by a distance within a range of larger than 97 μm and smaller than 100 μm,
the third impurity concentration peak is positioned away from the front surface by a distance within a range of larger than 105 μm and smaller than 108 μm, and
the impurity concentration peak for the impurities is positioned away from the front surface by a distance within a range of larger than 108 μm and smaller than 110 μm.

8. The semiconductor device as set forth in claim 1, wherein
a percentage of (i) a length from a front surface of the semiconductor layer of the second conductivity type that is oppositely positioned to a junction interface to a position of the first impurity concentration peak with respect to (ii) a length in the first direction of the semiconductor layer of the first conductivity type and the semiconductor layer of the second conductivity type falls within a range of higher than 77% and lower than 81%,
a percentage of (i) a length from the front surface to a position of the second impurity concentration peak with respect to (ii) the length in the first direction of the semiconductor layer of the first conductivity type and the semiconductor layer of the second conductivity type falls within a range of higher than 81% and lower than 86%,
a percentage of (i) a length from the front surface to a position of the third impurity concentration peak with respect to (ii) the length in the first direction of the semiconductor layer of the first conductivity type and the semiconductor layer of the second conductivity type falls within a range of higher than 93% and lower than 97%, and
a percentage of (i) a length from the front surface to a position of the impurity concentration peak for the impurities with respect to (ii) the length in the first direction of the semiconductor layer of the first conductivity type and the semiconductor layer of the second conductivity type falls within a range of higher than 97% and lower than 100%.

9. The semiconductor device as set forth in claim 1, wherein
the first impurity concentration peak is positioned away from a front surface of the semiconductor layer of the second conductivity type that is oppositely positioned to a junction interface by a distance within a range of larger than 54 μm and smaller than 57 μm,
the second impurity concentration peak is positioned away from the front surface by a distance within a range of larger than 57 μm and smaller than 60 μm,
the third impurity concentration peak is positioned away from the front surface by a distance within a range of larger than 65 μm and smaller than 68 μm, and
the impurity concentration peak for the impurities is positioned away from the front surface by a distance within a range of larger than 68 μm and smaller than 70 μm.

10. The semiconductor device as set forth in claim 1, further comprising:
a gate insulator film formed as a trench at least in part of the semiconductor layer of the second conductivity type; and
a gate electrode in contact with the gate insulator film.

11. The semiconductor device as set forth in claim 2, wherein
donors at each of the first to third impurity concentration peaks include donor complexes of hydrogen, vacancies and oxygen.

12. The semiconductor device as set forth in claim 1, wherein
the integrated concentration reaches a critical integrated concentration $n_c$ at a position closer to the rear main surface than a boundary between the second impurity concentration peak and a third impurity concentration peak of the plurality of impurity concentration peaks that is third closest to the front main surface.

13. A semiconductor device comprising:
a semiconductor layer of a first conductivity type having a first surface and a second surface that is oppositely positioned to the first surface; and
a semiconductor layer of a second conductivity type that is in contact with the first surface of the semiconductor layer of the first conductivity type, wherein
the semiconductor layer of the first conductivity type has a plurality of impurity concentration peaks that are differently positioned in a first direction extending from the first surface to the second surface,
the semiconductor layer of the first conductivity type further has a plurality of first impurity concentration peaks that are positioned between (i) a first impurity concentration peak of the plurality of impurity concentration peaks that is closest to the first surface and (ii) a second impurity concentration peak of the plurality of impurity concentration peaks that is closest to the second surface, the plurality of first impurity concentration peaks have lower impurity concentrations than the first impurity concentration peak and the second impurity concentration peak, the plurality of first impurity concentration peaks include a third impurity concentration peak that is third closest to the first surface, and the second impurity concentration peak is an impurity concentration peak for impurities other than protons at a position closer to the second surface than the third impurity concentration peak of the plurality of first impurity concentration peaks.

14. The semiconductor device as set forth in claim 13, wherein an impurity concentration at the first impurity concentration peak is lower than an impurity concentration at the second impurity concentration peak.

* * * * *